United States Patent [19]

Hester et al.

[11] Patent Number: 4,970,641

[45] Date of Patent: Nov. 13, 1990

[54] EXCEPTION HANDLING IN A PIPELINED MICROPROCESSOR

[75] Inventors: Phillip D. Hester, Austin, Tex.; William A. Johnson, San Jose, Calif.

[73] Assignee: IBM Corporation, Armonk, N.Y.

[21] Appl. No.: 344,429

[22] Filed: Apr. 26, 1989

Related U.S. Application Data

[63] Continuation of Ser. No. 782,745, Oct. 1, 1985, abandoned.

[51] Int. Cl.⁵ .............................................. G06F 12/10
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,921,153 | 11/1975 | Belady et al. | 364/200 |
| 3,947,823 | 3/1976 | Padegs et al. | 364/200 |
| 4,110,822 | 8/1978 | Porter et al. | 364/200 |
| 4,613,935 | 9/1986 | Couleur | 364/200 |

Primary Examiner—Michael R. Fleming
Assistant Examiner—Debra A. Chun
Attorney, Agent, or Firm—Skjerven, Morrill MacPherson, Franklin & Friel

[57] ABSTRACT

A method for processing address translation exceptions occurring in a virtual memory system employing demand paging and having a plurality of registers and a real storage area, includes the steps of: (a) temporarily storing for each storage operation; (i) the effective storage address for the operation; (ii) exception control word information relative to the ones of the registers involved in the operation and the length and type of the operation; and (iii) any data to be stored during the operation; (b) retrieving the temporarily stored information to form an exception status block if an exception is generated indicating a failed operation; and (c) reinitiating the failed operation based on the information contained in the exception status block.

7 Claims, 2 Drawing Sheets

EXCEPTION HANDLING IN A PIPELINED MICROPROCESSOR

This application is a continuation of U.S. patent application Ser. No. 06/782,745, filed 10/01/85 now abandoned.

CROSS-REFERENCES TO RELATED

Copending U.S. patent application Ser. No. 615,984, filed May 31, 1984, Data Processing System with CPU Register-To-Register Data Transfers Overlapped with Data Transfer To And From Main Storage, now U.S. Pat. 4,630,195, discloses a system in which register-to-register transfers within a CPU are overlapped with data transfers to and from main storage while eliminating or substantially reducing CPU storage cache requirements. Copending patent application Ser. No. 666,789, filed Oct. 31, 1984, Microcode Control of a Parallel Architecture Microprocessor, discloses a microprocessor which repeatedly attempts to execute separate micro-operations within a single microinstruction until all such micro-operations have been successfully completed. Both of the above identified applications are incorporated herein by reference.

BACKGROUND OF THE INVENTION

1. Field of the Invention

This invention relates to a data processing system having virtual memory and more particularly to such a system and methods employed therein for dealing with address translation exceptions in a demand paging system.

2. Description of the Prior Art

A hierarchical memory system may be formed which memory and a low-access-speed high-capacity memory as a secondary store. The main memory is usually an integrated circuit memory and the secondary store or memory is usually a magnetic disk memory. The purpose of the main memory is to provide appropriate transfer rates to and from a processing module, with data and other information being transferred from the secondary store or memory to the main memory as required. A virtual memory system may be created by providing a hierarchical memory system with the ability to automatically transfer requested information from the secondary store to main memory when that information does not reside in main memory at the time of its request. In this manner, the user is not aware of any inherent limitations due to the size of the main memory.

The advantage of a virtual storage implementation is that not all of the stored information, either program or data, needed for the progress of the computation is required to be stored in main memory simultaneously, but that for large periods of time, parts of the stored information may reside in the secondary store. This advantage follows from the fact that main memory is generally more expensive on a per unit or per bit basis than the secondary store. For virtual memory applications, the information is partitioned 1B into a number of segments such that, during the progress of the computation, the information of a segment will either be totally present in, or totally absent from, the main or primary store. If all the segments have the same size, they are generally referred to as pages, in which case the primary store is then subdivided into so-called page frames which are units of the store able to contain exactly one page.

In a virtual memory system, demand paging is provided so that computation can proceed at its full rate until an access to an absent page is required. Such a requirement is called a page fault and the computation causing the page fault is halted until the needed page can be brought into the primary store from the secondary store. As new pages are brought into the primary store, some other pages, already present in the primary store when the page fault occurred, must be sent back to the secondary store in order to make room for new pages. The number of pages or page frames provided in primary store for any given program is defined as the program window size.

Different programs, different processes within a given program, or even the same process with different data may require different program window sizes. Some processes may require a few number of instructions which are often recalled and other processes may require long strings of instructions. Some processes may require rather small amounts of data for a time while other processes may require large amounts of data at a given time.

In a computer system which implements storage address translation, the control program must be able to decide which physical page frames are allocated to pages in the large virtual address space. The most efficient means of making this decision is by demand paging. In this scheme, physical page frames are allocated to virtual pages only when required by a particular program which is executing, as indicated by an address translation exception created by that program. This requires that these exceptions be handled in the normal course of program execution, and that 1B the exceptions be completely transparent to the faulting routine.

There are two basic approaches to restarting a program which has encountered an addressing exception. One is to resume the program at the instruction which created the exception. This requires that no instruction complete until the results of the storage address translation (if required) are known, and (in many cases) that a partially-executed instruction be undone so that it may be re-executed. Since the processor must wait on the results of the translation before proceeding to the next instruction, there is no overlap in this technique and performance is relatively poor. However, the reporting mechanism is simple. An indication of the type of fault and the address of the faulting instruction is all that is required by the control program The control program corrects the exception condition and restarts the faulting routine by a return-from-interrupt to the faulting instruction.

Another prior art approach to restarting a program which has encountered an addressing exception is to resume the faulting program at the point where the exception was detected. This allows the processor to overlap subsequent instruction execution with address translation, but requires that it provide enough information about the faulting operation(s) to the control program so that the operation(s) may be restarted when the faulting program is restarted. The restart procedure may be quite complex, since the control program must restart these operations under the same processor state (e.g. problem state) that existed when the original operation(s) faulted.

In order for instruction execution to be effectively overlapped with address translation, the instruction set must be defined so that storage operations are decoupled from other instructions. For example, an instruction which allows the incrementing of a given storage location must necessarily wait on the results of the address translation before it completes.

The Motorola 68010 microprocessor employs a scheme 1B which restarts a faulting instruction at the point where it faulted instead of at its beginning. This eliminates the need to undo the partially executed instruction and in some cases reduces the number of virtual pages which must be allocated to storage for the faulting program when it is restarted. However, it requires that the processor save a large amount of information about its internal state (100 bytes) so that the instruction can be restarted at some intermediate point. The exception handling and restart sequence is therefore complex and inefficient. There is also little effective overlap of instruction execution with translation, but this is affected by the instruction set definition as well as the exception handling algorithm.

Another processor architecture allows the faulting routine to be restarted at the point where the exception was detected. The architecture provides a set of registers which indicate the storage operation type, address, and data. Certain instructions are defined to use the information in these registers to restart the faulting operation. This approach allows some overlap, but, since it is register-based, it limits the number of overlapped storage operations to one. Thus, sequences of multiple loads and stores, which are fairly common, do not execute at the maximum possible rate.

SUMMARY OF THE INVENTION

The invention described herein avoids all of the disadvantages of the methods described above Given a processor with decoupled loads and stores, this invention presents a comprehensive method for reporting and restarting faulting programs so that processor performance is maximized and control program complexity is minimized. It allows a large number of storage operations to be overlapped with instruction execution and it does not limit performance In one embodiment, the amount of information saved for each storage operation is 16 bytes, since partially-executed instructions are not exposed to the exception handler. Finally, it provides an extremely simple restart procedure for the control program. It does not rely on any additional instructions, but modifies the definition of the return-from-interrupt instruction.

BRIEF DESCRIPTION OF THE DRAWINGS

The Figure is a block diagram illustrating those portions of a data processing system needed to carry out the present invention.

DESCRIPTION OF THE PREFERRED EMBODIMENT

Figure 1:
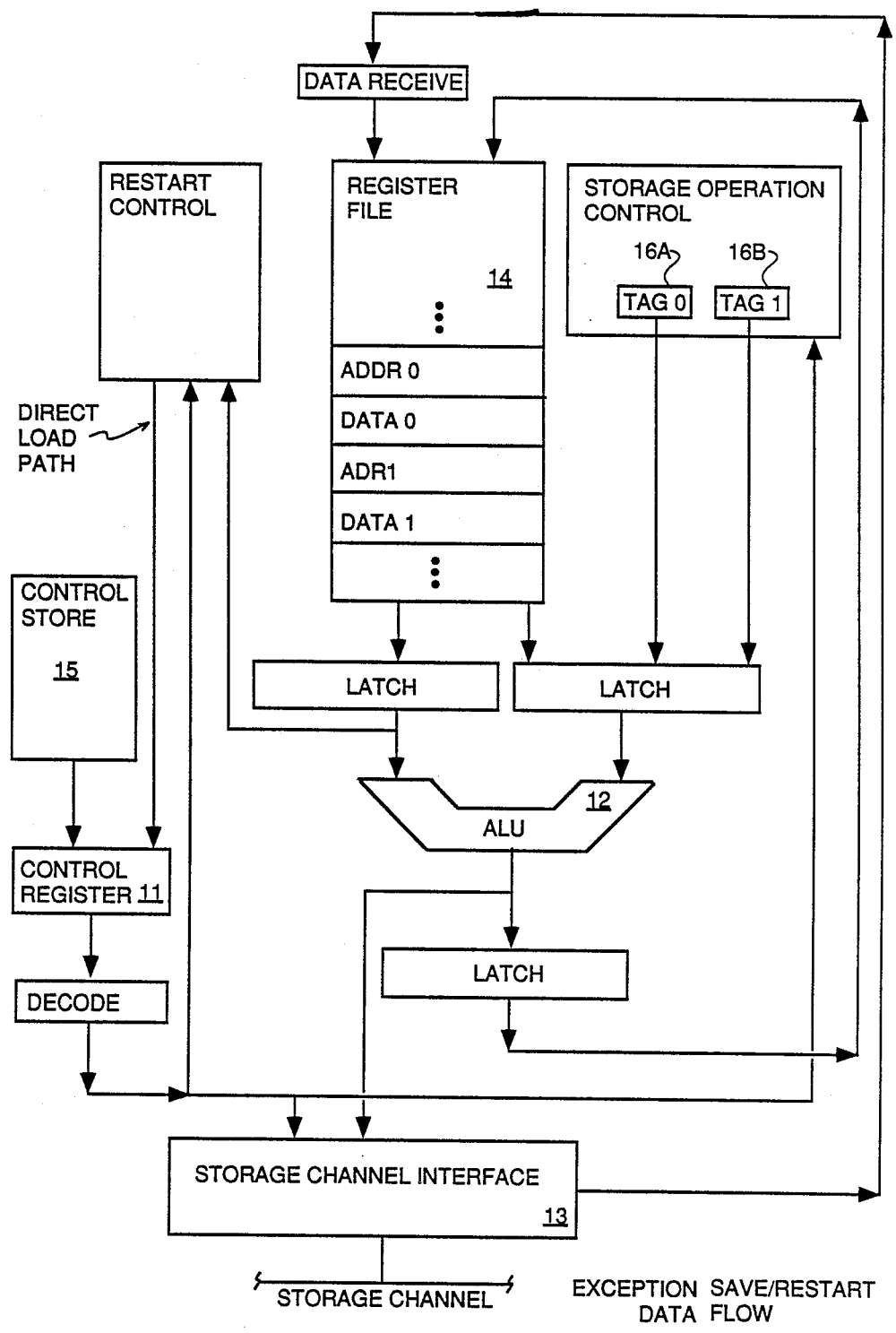
Figure 2:
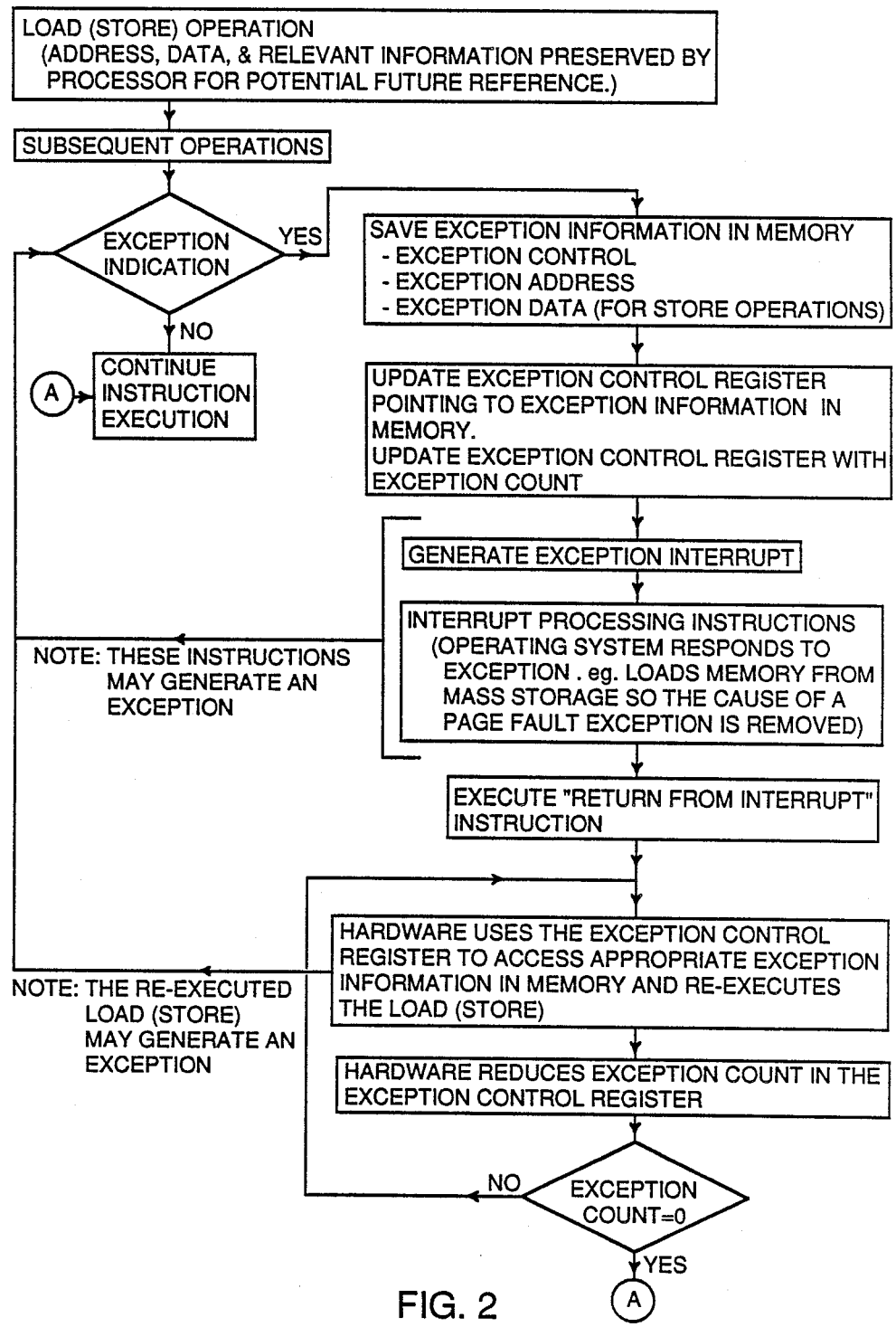
FIG. 2 is a flow chart illustrating the operation of the invention in handling exception and restart procedures.

The present invention employs a 32-bit register in the processor to control the saving of information about failing storage operations. This register is referred to as the Exception Control Register (ECR), and is manipulated as any other processor control register. Actual information about the failing storage operations is saved in the processor's main storage. The ECR is also used to control the restart of failing operations when the faulting program is restarted.

The Exception Control Register contains the exception count and storage address for information saved by the processor for failing storage operations. The contents of this register are defined as follows:

BITS 0-3 Reserved.

BITS 4-7 Exception Count. This four-bit field contains the exception count. When the processor is reporting exceptions, this field specifies the number of storage operations which created exceptions. When the processor is restarting failing operations, it indicates to the processor how many operations must be restarted.

BITS 8-31 Exception Save Address. This 24-bit field contains a real storage address. When the processor is reporting exceptions, this field specifies the main storage locations where information about the failing storage operations is saved. When the processor is restarting failing operations, it indicates about the failing operations so that they can be restarted.

During normal operation, the Exception Count in the ECR is set to zero. The Exception Save Address points to a block of real storage which has been reserved for saving information on the maximum number of operations which can be reported in any given implementation.

In one embodiment, the present invention provides for the saving of up to 16 bytes of information on each exception, and the actual information which is saved is processor-dependent. Table I below describes the present invention as it applies to one particular processor on which it was implemented.

TABLE I

| Exception Status Storage Block Definition | |
|---|---|
| Word 0 | Exception Control |
| Word 1 | Exception Address |
| Word 2 | Exception Data |
| Word 3 | Reserved |

Table I shows the definition of the storage block which is used to save information about a particular faulting storage operation. Each block consists of four storage fullwords (one fullword is four bytes wide). Only ten bytes are used for this particular implementation.

Exception Control Word

The first word of the Exception Status Storage Block is the Exception Control word. The Exception Control word consists of the following fields:

BITS 0-15 Reserved.

BITS 16-18 Register Set Number. This three-bit field indicates which one of the eight register sets was active when the exception occurred.

BITS 20-23 Register Number. This four-bit field specifies which one of sixteen general-purpose registers (GPR) was involved in the storage operation which encountered the exception. In the case of a load, this register number specifies which GPR was being loaded. In the case of a store, this register number specifies which GPR contained the store data. For Load Multiple (LM) and Store Multiple (STM) operations, this field specifies the first register whose load or store encountered the exception.

BITS 24-25 Operation Length. This two-bit field specifies the length of the storage operand as defined below:

00 BYTE (8 BITS)
01 HALFWORD (16 BITS)
10 FULLWORD (32 BITS)
11 HALFWORD TEST AND SET

BITS 26–28 Operation. This three-bit field specifies the type of operation that caused the exception as defined below:
  000 LOAD
  001 LOAD MULTIPLE
  010 PROGRAMMED INPUT/OUTPUT (PIO) READ
  011 ALGEBRAIC LOAD (SIGN-EXTEND)
  100 STORE
  101 STORE MULTIPLE
  110 PIO WRITE
  111 Reserved BITS 29–30 Reserved.

BIT 31 Cancelled. This bit indicates whether the operation was cancelled when the exception was detected. Since storage operations are overlapped with subsequent instruction execution, an instruction which follows a load may alter the register which was loaded. The load in this case is cancelled. If an exception is then detected on a cancelled load, the exception is reported, but the load operation cannot be restarted. If this bit is set to one, the operation was cancelled, and is not restarted. If it is set to zero, the operation has not been cancelled, and is restarted.

Exception Address Word

The second word of the Exception Status Storage Block is the Exception Address word. The Exception Address word consists of the following information:

BITS 0–31 Exception Address. This word contains the 32-bit effective storage address for failing storage and I/0 operations.

Exception Data Word p The third word of the Exception Status Storage Block is the Exception Data word The Exception Data word consists of the following information:

BITS 0–31 Exception Data This word contains the 32-bit data quantity for failing storage or I/O operations if the failing operation were a single store or I/O write. This word is undefined if the failing operation were a load, load multiple, IOR, or store multiple.

The fourth word of the Exception Status Block is reserved.

Storage Operation Exception Save

When the processor detects an exception, it completes the current instruction, unless that instruction depends on the storage operation being successful. For example, an ADD of two registers where one has been previously loaded from main storage cannot be completed if the load caused a storage exception. If the current instruction cannot be completed, it is cancelled. The program is later restarted at this instruction.

Upon the completion or cancellation of the current instruction, the processor must wait for all current storage operations to complete. This is so that the results of all pending storage operations may be known: information must be saved on all operations which caused exceptions, and they must be saved in the proper order. It is possible that the first exception which is detected was not caused by the operation which was issued first. When all storage operations have completed, the processor saves information on each operation which caused an exception, beginning with the operation which was issued most recent to the point of the exception, and proceeding in order to the operation which was issued least recent to the point of the exception. For each exception, the procedure for saving the information is as follows:

1. The Exception Save Address in the ECR is decremented by pixteen (four words).
2. The Exception Count in the ECR is incremented by one.
3. The Exception Control word for the next operation is saved at the real storage address specified by the Exception Save Address in the ECR. 4. The Exception Address for the next operation is saved at the real storage address given by adding four to the Exception Save Address. The value in the ECR is not changed.
5. The Exception Data for the next operation is saved at the real storage address given by adding eight to the Exception Save Address. The value in the ECR is not changed. In the cases where this Exception Data does not need to be saved, the quantity is meaningless. However, it is easier to treat all cases alike.

When the information on all exceptions has been saved, the Exception Count indicates how many operations are to be restarted. The Exception Save Address points to the Exception Control word of the first operation to be restarted. Additional operations to be restarted have information in sequential main storage locations beyond the Exception Save Address location. These operations appear in order of restart.

Storage Operation Restart

Storage operations are restarted as part of the return-from-interrupt sequence in this invention They are restarted after the new processor status is loaded, but before any instructions in the target instruction stream are executed. This means that the operations are restarted under the original processor status. To the failing routine, there is no difference in the operations which were restarted and those which were issued by the original instructions.

The return-from-interrupt instruction is defined such that storage operations are conditionally restarted during the return-from-interrupt, based on bits in the instruction. Before returning to the program which encountered the exception, the control program must correct the exception condition and set the ECR to contain the same Exception Count it contained when the exception was reported. If the Exception Status Blocks have been moved or copied in main storage, the Exception Save Address must be changed to reflect this change. The order of Exception Status Blocks must be preserved, however. The operations are restarted in order of increasing Exception Status Block addresses according to the following sequence:

1. If the Exception Count in the ECR is zero, there are no remaining operations to restart. Execution proceeds to the first instruction in the target instruction stream.
2 The Exception Control word for the next operation to be restarted is fetched from the real storage address given by Exception Save Address in the ECR. The ECR is not modified.
3. The Exception Address for the next operation to be restarted is fetched from the real storage address given by Exception Save Address plus four. The ECR is not modified.
4. The Exception Data for the next operation to be restarted is fetched from the real storage address given by Exception Save Address plus eight. The ECR is not modified.

5 The Exception Count in the ECR is decremented by one. The Exception Save Address is incremented by sixteen. The Exception Save Address then points to the next operation to be restarted (if it exists). 6. The operation is restarted using the information fetched in steps 2, 3, and 4 above. Once this operation is restarted, the restart sequence begins again with step 1.

Exceptions During Restart

If more than one exception is reported, the control program does not necessarily have to correct the exception condition for each one. In fact, it may not be possible to correct them all. The exception condition must be corrected only for the first operation to be restarted. Thus it is possible that storage operations may again encounter exceptions when they are restarted.

This possibility is handled automatically by the way the Exception Count and Exception Save Address are treated. Any exceptions during restart occur after the Exception Status Block has been saved, the Exception Count has been decremented, and the Exception Save Address has been incremented. The storage which contained the Exception Status storage block is no longer needed. Thus, if an exception occurs during restart, the information about the operation which caused the exception is saved using the procedure described previously. The information about any operations which have not been restarted when the exception occurs is still preserved in main storage. The order of restart is also preserved.

Serialization

In order to restart failing storage operations in the same environment in which they were originally executed, it is necessary to serialize certain operations. Serialization consists of completing all logically prior storage operations before the next operation occurs in order to insure that all exceptions are reported before the environment is changed. The processor must serialize all interrupts and the execution of the following instructions:

1. Any control instruction which may alter the processor status.
2. Supervisor Call.
3. Return-from-Interrupt.
4. Input/Output Write. This operation may be used to change the address translation results for a previous operation. If this change were to occur, the operation could not be restarted.

The following events occur during serialization:

1. All logically prior storage operations are completed. 2. The normal function associated with the serialization operation is performed. In the case of instruction execution, the instruction is executed after all logically prior storage operations have completed. In the case of interrupts, the PSW swap is performed after all logically prior storage operations have completed.
3. Normal instruction execution resumes.

Serialization is a common method of insuring that all operations can be restarted. However, it is not part of this invention, and is included here only for completeness. This invention does allow a significant amount of overlap in the PSW swap case, even though the serialization requirements are still enforced. The storage accesses for the PSW swap may be issued before all previous accesses have completed: it is the processor status change which cannot complete until the results of all previous accesses are known. The processor need only be able to recognize the PSW swap accesses as special cases which are not reported if an exception occurs on a previous access.

Implementation

The present invention may appear initially to require a substantial amount of additional control logic for the saving and restarting of failing storage operations. However, it has been designed to take maximum advantage of logic which already exists to overlap storage accesses with subsequent instruction execution The operation of this logic is described in the above identified copending patent application Ser. No. 615,984, "Data Processing System with CPU Register-to-Register Data Transfers Overlapped with Data Transfer To And From Main Storage".

The single figure of the present application shows a high-level data flow of the processor, emphasizing the sections needed to control storage accesses. Storage operations originate in the Control Register 11 due to execution of microcode supplied from control store 15. During the execution of the storage operation microword, the following events take place:

1. The effective address of the storage operation is calculated in the ALU 12 and sent to the storage channel interface 13. There is no register file write-back required by this execution cycle, so the register file 14 is available to accept the address from the output of the ALU. This address is saved in a temporary location so that it may be saved if an exception occurs. This location cannot be reused until the current storage operation completes.

2. Controls must be set in a tag register such as 16a and 16b to control the execution of the storage operation on subsequent cycles. The information in the tag register has a one-to-one correspondence to information defined for the 3. Exception Control word in the Exception Status Block. The tag register cannot be reused until the current storage operation completes.

3. The storage channel interface 13 is notified of the operation type, data length, etc., and the storage channel logic then completes the operation without further processor intervention.

4. Any store data required for the operation is sent on the next microcode cycle. This data is saved in a temporary register file location in file 14 as the effective address was. Again, this location cannot be reused until the storage operation completes.

The processor can issue up to sixteen operations, as long as there are available tag registers to control the accesses, and as long as there are temporary register file locations to save the addresses and data for those operations. With the system shown in the drawing, no more than two operations can be pending at any given time. It will be noted that each tag register 16a, 16b must have associated with it an indication of the order of its operation relative to the other pending operations. This is IB required so that the Exception Status Blocks may be saved in the proper order if multiple exceptions occur. Saving Exception Information If the storage channel interface 13 indicates that a given operation has an exception, the tag register, temporary address buffer, and temporary data buffer for that operation are locked. That is, they cannot be used for any additional storage operations until the exception is reported To save the Exception Status Block for a given operation, the processor simply saves the content of its associated tag register in the Exception Control Word, the content of the temporary address buffer in the Exception Address word, and the content of the temporary data buffer in the Exception Data word. The tag register, address buffer, and data buffer for that operation are freed after the Exception Status Block has been saved.

It is possible to have the maximum number of pending storage operations with an exception on every one. This leads to the situation where all tags, address buffers, and data buffers are locked when the processor begins saving Exception Status Blocks. Thus the processor cannot use any tag, address buffer, or data buffer when storing the Exception Status Blocks. This does not create a problem since this information is saved using untranslated stores which cannot cause exceptions. Also, since stores are used, there is no need for the processor to use tag registers to control the write-back of storage data into the register file.

Operation Restart

The restarting of storage operations is fairly straightforward. The processor simply fetches the Exception Status Blocks in the proper order, using the Exception Address in the ECR. The operation is restarted from the Control Register 11, so that the control of the restart is identical to the control of the original operation, greatly simplifying the logic required. This is accomplished by establishing a strong relationship between microcode bits in the Control Register and bits in the Exception Control Word. The Exception Control word bits are then loaded directly into the Control Register along with microcode bits which do not vary between various storage operation restarts (for example, the ALU controls are not variable since the effective address is already known). If the Exception Control word indicates that the operation was cancelled, or if it specifies an operation which could not have been created by an instruction, the Control Register is simply loaded with a NO/OP instead of the storage restart operation.

The invention described herein provides a comprehensive method of reporting and recovering from address translation exceptions in a demand paging environment. This technique was implemented on a processor which had previously restarted the failing program at the instruction which caused the exception. The implementation of the technique described here resulted in a 30% improvement in processor performance.

We claim:

1. A method for processing one or more address translation exceptions during storage operations involving loading or storing of data in a virtual memory system having a single central processing unit and employing demand paging and having a plurality of registers and a real storage area, said system having effective storage addresses for loading or storing of said data and utilizing said registers in said storage operations, comprising the steps of:
   (a) temporarily storing for each of said storage operations;
      (i) said effective storage address for said operation;
      (ii) exception control word information relative to an identity of ones of said registers involved in said storage operations and a length of said data involved in said operation and a type of said operation; and
      (iii) any data to be stored during said operation;
   (b) retrieving said temporarily stored information to form an exception status block when an exception is generated indicating a failed operation; and
   (c) reinitiating said failed operation based on the information contained in said exception status block.

2. A method in accordance with claim 1 including the step of maintaining a count of a number of said exceptions which occur.

3. A method in accordance with claim 1 including the step of storing a starting address in said real storage area where information relative to a failed storage operation is stored.

4. A method in accordance with claim 3 including the step of storing information relative to said failed operation in said storage area starting at said stored starting address.

5. A method in accordance with the claim 1 including the step of reinitiating sequentially failed ones of said operations.

6. A method in accordance with claim 5 in which said failed operations are reinitiated in the sequence in which they failed.

7. A method in accordance with claim 5 in which exception status blocks are formed for each of said failed operations.

* * * * *

UNITED STATES PATENT AND TRADEMARK OFFICE
CERTIFICATE OF CORRECTION

PATENT NO. : 4,970,641
DATED : November 13, 1990
INVENTOR(S) : Phillip D. Hester and William A. Johnson It is certified that error appears in the above-identified patent and that said Letters Patent is hereby corrected as shown below:

Column 1, line 35, after "which" insert -- employs a high-access-speed low-capacity memory as a main --.

Column 1, line 60, delete "1B".

Column 2, line 33, delete "1B".

Column 3, line 5, delete "1B".

Column 3, line 50, "The Figure" should read --Figure 1--.

Column 4, line 15, after "indicates", insert -- from where the processor should fetch information --.

Column 5, line 15, delete "B".

Column 5, line 33, "Exception Data Word" should be a separate heading.

Column 5, line 33, after "word" delete "p".

Column 5, line 35, after the first occurance of "word", insert --.--.

UNITED STATES PATENT AND TRADEMARK OFFICE
CERTIFICATE OF CORRECTION

PATENT NO. : 4,970,641
DATED : November 13, 1990
INVENTOR(S) : Phillip D. Hester and William A. Johnson It is certified that error appears in the above-identified patent and that said Letters Patent is hereby corrected as shown below:

Column 6, line 4, "pixteen" should read --sixteen--.

Column 6, line 9, "4. The Exception" should begin a new line.

Column 8, line 38, delete "3.".

Signed and Sealed this

Fifteenth Day of September, 1992

Attest:

DOUGLAS B. COMER

*Attesting Officer*   Acting Commissioner of Patents and Trademarks